(12) United States Patent
Dietz (10) Patent No.: US 11,422,215 B2
(45) Date of Patent: Aug. 23, 2022

(54) GRADIENT COIL UNIT FOR A MAGNETIC RESONANCE DEVICE INCLUDING AN EDDY CURRENT COMPENSATING CONDUCTOR STRUCTURE

(71) Applicant: Siemens Healthcare GmbH, Erlangen (DE)

(72) Inventor: Peter Dietz, Fuerth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/123,335

(22) Filed: Dec. 16, 2020

(65) Prior Publication Data
US 2021/0181279 A1 Jun. 17, 2021

(30) Foreign Application Priority Data

Dec. 16, 2019 (DE) .......................... 102019219755.8

(51) Int. Cl.
*G01R 33/385* (2006.01)
*G01R 33/565* (2006.01)

(52) U.S. Cl.
CPC ... *G01R 33/3852* (2013.01); *G01R 33/56518* (2013.01)

(58) Field of Classification Search
CPC ..................... G01R 33/3852; G01R 33/56518
See application file for complete search history.

(56) References Cited

U.S. PATENT DOCUMENTS

| | | | |
|---|---|---|---|
| 4,733,189 A | 3/1988 | Punchard et al. | |
| 7,852,086 B2 * | 12/2010 | Kimmlingen | G01R 33/4215 324/322 |
| 2002/0079897 A1 * | 6/2002 | Ham | G01R 33/385 324/318 |
| 2017/0160357 A1 | 6/2017 | Biber et al. | |
| 2019/0033405 A1 | 1/2019 | Fath et al. | |
| 2019/0331748 A1 * | 10/2019 | Dietz | G01R 33/385 |

FOREIGN PATENT DOCUMENTS

| | | |
|---|---|---|
| DE | 102015224043 A1 | 6/2017 |
| DE | 102017213026 A1 | 1/2019 |
| DE | 102018206643 A1 | 10/2019 |
| EP | 3561534 A1 | 10/2019 |

OTHER PUBLICATIONS

Weiger, Markus et al "A high-performance gradient insert for rapid and short-T2 imaging at full duty cycle." in: Magnetic resonance in medicine 79.6 (2018): 3256-3266.
Elster, Allen D:; "X- and Y-Gradients"; Questions and Answers in MRI; URL: http://mriquestions.com/x-and-y--gradients.html, Nov. 5, 2020.
German action dated Nov. 9, 2020, Application No. 10 2019 219 755.8.

* cited by examiner

*Primary Examiner* — G. M. A Hyder
(74) *Attorney, Agent, or Firm* — Banner & Witcoff Ltd.

(57) ABSTRACT

The disclosure relates to a gradient coil unit comprising at least one first conductor structure, which is configured to generate a magnetic field gradient in a first direction, and an eddy current compensating conductor structure, which is configured to compensate for a first magnetic field. The first magnetic field is generated by a current induced in the first conductor structure as a result of activation of a conductor structure comprised by the gradient coil unit.

12 Claims, 8 Drawing Sheets

GRADIENT COIL UNIT FOR A MAGNETIC RESONANCE DEVICE INCLUDING AN EDDY CURRENT COMPENSATING CONDUCTOR STRUCTURE

CROSS-REFERENCE TO RELATED APPLICATIONS

The present application claims the benefit of the filing date of German patent application no. DE 10 2019 219 755.8, filed on Dec. 16, 2019, the contents of which are incorporated herein by reference in their entirety.

TECHNICAL FIELD

The present disclosure relates to a gradient coil unit comprising a first conductor structure and an eddy current compensating conductor structure, a gradient system, and a magnetic resonance device.

BACKGROUND

In a magnetic resonance device, the body of an examination object to be examined, such as a patient, is usually exposed to a relatively high main magnetic field in a patient-receiving region with the aid of a main magnet, for example, of 1.5, 3, or 7 tesla. In addition, gradient pulses are generated with the aid of a gradient coil unit. Radio frequency pulses with a high frequency (RF pulses), in particular excitation pulses, are then emitted via appropriate antenna facilities, which leads to the nuclear spins of certain atoms that have been resonantly excited by these RF pulses being tilted around a defined flip angle with respect to the magnetic field lines of the main magnetic field. During relaxation of the nuclear spins, radio frequency signals known as magnetic resonance signals are emitted, these signals being received by means of appropriate radio frequency antennas and then further processed. From the raw data thus acquired, the desired image data can finally be reconstructed. The examination object is at least partly positioned within the examination region. The examination region is typically the spatial region from which the raw data are acquired.

A gradient coil unit is typically embodied to generate magnetic field gradients in at least one spatial direction. The gradient coil unit is controlled by electric currents, the amplitudes of which reach several hundred amps (A), and which are subjected to fast and frequent changes in the direction of the current with rise and decay rates of several hundred kA/s.

A magnetic field gradient is therefore a time-variable magnetic field that generates eddy currents, insofar as the time-variable magnetic field impacts on conductor structures, such as, for example, the cryostat of the main magnet in the magnetic resonance device. Likewise, eddy currents can occur for example, in a radio frequency antenna unit that is included in the magnetic resonance device; these eddy currents generate heat and/or noise. One cause of this may be the very short time constants in the very thin copper layers used for the radio frequency antenna unit, which are at room temperature. A magnetic field gradient can also induce an eddy current in conductor structures of the gradient coil unit itself, which is typically compensated for by means of an adaptively regulated electric current in the respective conductor structure.

SUMMARY

Stronger magnetic field gradients and/or rise and decay rates typically allow faster acquisition of raw data and/or a higher resolution of image data. In particular, with examinations of the head of an examination object, particularly with diffusion-weighted imaging and/or when using a magnetic resonance device with a main magnetic field of more than 3 tesla, particularly strong magnetic field gradients of up to 250 mT/m with rise and decay rates of up to 1000 T/s/m, in special cases up to 2000 T/s/m are desirable. This leads to increasing eddy currents.

In the examination region, eddy currents, in particular eddy currents of a higher order, can influence the quality of image data through ghosting. Likewise, the fat saturation can be particularly severely impaired. One option for reducing ghosting is the flyback method. For example, with asymmetrical gradient coil units and/or local gradient coil units for positioning within a patient-receiving region of the magnetic resonance device, the effect cannot be eliminated; however, as a result of the eddy currents (See Weiger, Markus, et al. "A high-performance gradient insert for rapid and short-T2 imaging at full duty cycle." Magnetic resonance in medicine 79.6 (2018): 3256-3266).

Therefore, further developments for gradient coil units mainly relate to an improved stray field compensation, such as, for example, EP3561534, an improved force compensation, such as, for example, DE 10 2018 206 643, and/or integrated shimming, such as, for example, DE 10 2017 213 026.

The disclosure addresses the problem of providing a gradient coil unit to generate magnetic field gradients with particularly high homogeneity and, at the same time, high rise and decay rates, with particularly good vortex field compensation. This problem is solved by the features as described throughout the disclosure with respect to the various embodiments, as well as in the claims.

The disclosure relates to a gradient coil unit comprising at least one first conductor structure, which is embodied to generate a magnetic field gradient in a first direction, and an eddy current compensating conductor structure. The eddy current compensating conductor structure is embodied to compensate for a first magnetic field, which first magnetic field is generated by a current that is induced in the first conductor structure as a result of the activation of a conductor structure that is comprised by (e.g. contained within or included as part of) the gradient coil unit.

A conductor structure, e.g. the first conductor structure and/or the eddy current compensating conductor structure, typically comprises an electrical conductor. The geometrical arrangement of an electrical conductor can be referred to as a conductor structure. The first conductor structure and the eddy current compensating conductor structure are typically electrically isolated from each other.

The gradient coil unit, e.g. the first conductor structure, is embodied to generate a magnetic field gradient in a first spatial direction. The gradient coil unit can include additional first conductor structures to generate magnetic field gradients in additional spatial directions. The gradient coil unit may comprise at least one, and preferably two, additional first conductor structures to generate a magnetic field gradient in at least one spatial direction, and preferably in two additional spatial directions. The gradient coil unit preferably comprises, for each additional first conductor structure, an additional eddy current compensating conductor structure that is assigned respectively to an additional first conductor structure. The respective additional eddy current compensating conductor structure is typically embodied to compensate for an additional first magnetic field induced in the additional first conductor structure that is assigned thereto, which additional first magnetic field is generated by a current induced in the additional first conductor structure as a result of activation of a conductor structure comprised by the gradient coil unit. The two additional spatial directions are typically orthogonal to each other. The two additional spatial directions are typically orthogonal, respectively, to the first spatial direction.

The first conductor structure can be embodied, alone and/or in combination with a further conductor structure, to generate the magnetic field gradient in the first direction. The activation of the first conductor structure typically ensues by applying a first electric current in the first conductor structure. The activation of a conductor structure that is comprised by the gradient coil unit typically ensues by applying an electric current in this conductor structure. The magnetic field gradient and/or further electromagnetic fields and/or magnetic fields that occur during the generation of the magnetic field gradients can interact with a conductor structure and induce an electric current in this conductor structure. Thus, a current can be induced in the first conductor structure, originating from the activation of the first conductor structure, and/or originating from a different conductor structure that is comprised by the gradient coil unit.

The eddy current compensating conductor structure may be implemented such that, when the eddy current compensating conductor structure is activated by generating a compensating current in the eddy current compensating conductor structure, an eddy current compensation field is generated. The eddy current compensation field may be implemented such that this is aligned inversely and/or opposite to the first magnetic field. The first magnetic field is characterized in that, when at least one conductor structure comprised by the gradient coil unit, typically a combination of all the conductor structures comprised by the gradient coil unit, is activated, an electric current is induced in the first conductor structure, which for its part induces the first magnetic field. The first magnetic field is accordingly a vortex field which is generated indirectly by the first conductor structure, and which is based on eddy currents induced in the first conductor structure.

The eddy current compensation field may also be implemented such that, in the first conductor structure, this generates a current that is inverse to the current that has been induced, as a result of which, in the activation of a conductor structure comprised by the gradient coil unit, the current induced in the first conductor structure is compensated.

Compensation for a current that is induced in the first conductor structure during the activation of a conductor structure comprised by the gradient coil unit can ensue indirectly by generating an eddy current compensation field, wherein the eddy current compensation field is aligned inverse and/or opposite to a magnetic field as a result of the current induced in the first conductor structure. Compensation for a current that is induced in the first conductor structure during the activation of a conductor structure comprised by the gradient coil unit can ensue directly by inducing a current that is aligned inverse and/or opposite to the current induced in the first conductor structure.

The compensating current is typically determined as a function of the first magnetic field. This determination typically ensues prospectively and/or as a result of an anticipated current induced in the first conductor structure as a result of activation of a conductor structure comprised by the gradient coil unit. The current induced can be generated by activating each conductor structure comprised by the gradient coil unit, e.g. by activating the first conductor structure and/or an additional first conductor structure and/or a further conductor structure and/or the eddy current compensating conductor structure. The first conductor structure and/or additional first conductor structures and/or further conductor structures and/or the eddy current compensating conductor structure can typically be activated independently of one another. The activation thereof typically ensues in a controlled manner and/or after the specification of an MR control sequence. For example, the activation of the eddy current compensating conductor structure can itself induce an electric current in the first conductor structure and consequently contribute to the first magnetic field. This contribution of the eddy current compensating conductor structure to the first magnetic field is typically taken into account in the determination of the compensating current.

The compensation and/or the compensating current is typically such that account is taken at least by one conductor structure comprised by the gradient coil unit, e.g. by all the conductor structures comprised by the gradient coil unit of the interaction thereof with the first conductor structure. The interaction can be dependent on an activation of the respective conductor structure according to a given MR control sequence, e.g. a course over time and/or an amplitude of an electric current. The compensating current is typically time-dependent.

The eddy current compensation field is typically a multipole field, with a dipole field being dominant. The amplitude of the required compensating current is typically lower than the current induced in the first conductor structure. One cause of this is that the first magnetic field and the eddy current compensation field that runs counter thereto very much cancel each other out at a distance as a result of a dipole that has a small extent.

The eddy current compensating conductor structure may be implemented such that, by an individual positioning of an electrical conductor, typically on a cylindrical surface, that is, in a saddle shape, it replicates the distribution of the first magnetic field.

It is likewise conceivable that part of the first conductor structure acts as an eddy current compensating conductor structure, that is, may be implemented to compensate for a first magnetic field. In this case, a separate activation of the part of the first conductor structure that acts as an eddy current compensating conductor structure and of the remaining part of the first conductor structure is required.

It was realized that the eddy current compensating conductor structure comprises an inductive coupling with the first conductor structure. The greater the radial distance between the first conductor structure and the eddy current compensating conductor structure, the lower is the inductive coupling between the two conductor structures. The greater the radial distance between the first conductor structure and the eddy current compensating conductor structure, the lower is the precision of the eddy current compensation field for the first magnetic field. The radial distance between the first conductor structure and the eddy current compensating conductor structure may be any suitable range of values, such as for example between 1 cm and 15 cm, between 2 cm and 12 cm, between 3 cm and 7 cm, etc.

It was realized that the skin depth of the eddy currents depends on the frequency at which the gradient coil unit is activated. Consequently, the position of the current induced in the first conductor structure changes with the frequency at which the gradient coil unit is activated, as a result of which the first magnetic field depends on the frequency. As the frequency at which the gradient coil unit is activated increases, the amplitude of the currents induced typically increases.

The eddy current compensating conductor structure may be optimized for higher frequencies, e.g. frequencies greater than 800 Hz, frequencies between 1000 Hz and 5000 Hz, etc. The eddy current compensating conductor structure is therefore arranged such that the eddy current compensation field may be generated to compensate with particularly high precision for the first magnetic field that occurs at these frequencies.

It was realized that, depending on the conductor structures comprised by the gradient coil unit, in particular the shapes thereof and/or the geometrical arrangement thereof, a current can be induced locally in the first conductor structure, e.g. only in at least one partial region of the first conductor structure. The current induced in the first conductor structure by the activation of a conductor structure comprised by the gradient coil unit can accordingly only develop, for example, on parts and/or partial regions of the first conductor structure. In particular, if a conductor structure, for example the first conductor structure, comprises sections within which sections there ensues within a conductor, as a result of induction, an influx at one end and a reflux at the opposite end of the same conductor, strong local magnetic fields are generated, which impairs the quality of the raw data that are to be recorded. It was realized that compensating for such local magnetic fields, e.g. magnetic fields of a higher order, by means of an adaptively regulated electric current in the respective conductor structure, is not possible.

The advantage of the gradient coil unit according to the disclosure is that a local vortex field can be dedicated and compensated for with precision by means of the eddy current compensating conductor structure. For instance, in the case of magnetic field gradients that are to be generated with high rise and decay rates and/or in the case of an electric current induced in only one partial region of the first conductor structure and of a first magnetic field resulting therefrom, the gradient coil unit according to the disclosure, e.g. the eddy current compensating conductor structure, can efficiently prevent and/or reduce the emergence of vortex fields within the examination region. This allows there to be a shorter distance of the gradient coil unit and/or of the first conductor structure from the examination region, e.g. from the examination object. In the same way, the gradient coil unit according to the disclosure allows higher rise and decay rates, since the eddy currents increase with increasing rise and decay rates, which can be compensated for efficiently, however.

One embodiment of the gradient coil unit makes provision for the first conductor structure and the eddy current compensating conductor structure to be saddle-shaped. The first conductor structure is typically arranged on a first cylinder. The eddy current compensating conductor structure is typically arranged on a second cylinder. The first conductor structure is typically embodied so as to generate a magnetic field gradient perpendicular to the cylinder axis. Here, the radius of the first and/or second cylinder typically determines the curvature of the first conductor structure and/or of the eddy current compensating conductor structure in a radial direction. Such a gradient coil unit can be activated efficiently. Such a gradient coil unit is compatible with many common magnetic resonance devices.

One embodiment of the gradient coil unit makes provision for the first conductor structure and eddy current compensating conductor structure to have a different radial distance from the center of the gradient coil unit. Typically, the eddy current compensating conductor structure has a smaller curvature, i.e. a greater radius to the longitudinal axis of the preferably cylinder-shaped gradient coil unit than the first conductor structure.

According to this embodiment of the gradient coil unit, the gradient coil unit may be implemented to have at least two layers, with the first conductor structure and the eddy current compensating conductor structure each being arranged on different layers in a saddle shape. The radial distance of the eddy current compensating conductor structure from the center point and/or the longitudinal axis of the gradient coil unit may be greater than the radial distance of the first conductor structure from the center point and/or the longitudinal axis of the gradient coil unit. As a result thereof, the first conductor structure can generate the magnetic field gradient in the first direction in a particularly efficient and uninterrupted manner through the vicinity to the examination region, wherein the arrangement of the eddy current compensating conductor structure outside the first conductor structure allows a good vortex field compensation in the examination region. For example, this embodiment allows the first conductor structure to be initially independent of the eddy current compensating conductor structure and/or to be able to be embodied such that the first conductor structure is embodied to generate a desired magnetic field gradient. Here, the first conductor structure in a conventional conductor structure can be equivalent to the generation of a magnetic field gradient. The eddy current compensating conductor structure is embodied individually for the first conductor structure, e.g. dependent on further conductor structures comprised by the gradient coil unit, such that the magnetic field gradient generated by the first conductor structure is free from vortex fields.

One embodiment of the gradient coil unit makes provision for the first conductor structure to be embodied asymmetrically. A first magnetic field induced in an asymmetrical shape by an asymmetrical first conductor structure, e.g. a vortex field, has a particularly high amplitude and/or long time constant compared with a vortex field induced by a symmetrical conductor structure. In the same way, a first magnetic field induced by an asymmetrical first conductor structure typically only develops in a partial region of the gradient coil unit, which field cannot be compensated for by means of an adaptively regulated electric current in the first conductor structure. Consequently, only a separate eddy current compensating conductor structure allows an efficient and effective compensation for a first magnetic field generated by an asymmetrical first conductor structure. In the same way, this embodiment of the gradient coil unit allows rise and decay rates of several hundred kA/s in combination with a first conductor structure positioned close to the examination region, e.g. when the gradient coil unit is embodied as a local gradient coil unit, e.g. embodied as a dedicated head gradient coil unit. A head gradient coil unit is typically particularly suitable when the examination region surrounds only the head of the examination object, which can be achieved particularly well by means of an asymmetrical local gradient coil unit. A local gradient coil unit, e.g. a head gradient coil unit, typically has fewer limitations regarding SAR and peripheral nerve stimulation than a main gradient coil unit. According to this embodiment, the eddy current compensating conductor structure allows an efficient compensation for the first magnetic field, and consequently reduces the heat generated in the examination object, even when placed close to the examination object, for example, at a distance of less than 10 cm from the examination object. In the same way, the homogeneity of the magnetic field gradient and/or of the main magnetic field inside the examination region is improved. In particular, the specific problems of eddy currents of higher order disclosed in Weiger, Markus, et al. "A high-performance gradient insert for rapid and short-T2 imaging at full duty cycle." Magnetic resonance in medicine 79.6 (2018): 3256-3266, (last line, paragraph 2) are also addressed and solved.

One embodiment of the gradient coil unit makes provision for the first conductor structure to surround a first center point in a spiral shape. The first conductor structure may also be implemented to be at least partly helical and/or annular and/or circular. The first conductor structure may surround maximally and/or exactly a first center point in a spiral shape and/or at least partly in a helical and/or annular and/or circular shape. Such a first conductor structure is well embodied to generate a magnetic field gradient in the head of an examination object. The eddy current compensating conductor structure may surround maximally and/or exactly a second center point in a spiral shape and/or at least partly in a helical and/or annular and/or circular shape. In the case of an asymmetrical first conductor structure surrounding only one first center point, a current induced in the first conductor structure is concentrated in the area surrounding the first center point as a result of activation of a conductor structure comprised by the gradient coil unit. Accordingly, the first magnetic field is concentrated in the region of the first center point. Such a first magnetic field that is generated can typically only be compensated for by means of the eddy current compensating conductor structure. This embodiment of the gradient coil unit accordingly allows the generation of image data for the head, e.g. of diffusion-weighted images, of particularly high quality.

One embodiment of the gradient coil unit makes provision for the eddy current compensating conductor structure to surround a second center point in a spiral shape and for the first center point and the second point to have a distance apart of less than any suitable proportion of the of the length of the gradient coil unit, such as for example 20%, less than 10%, less than 5% of the length of the gradient coil unit, etc.

The eddy current compensating conductor structure may be implemented such that the eddy current compensating conductor structure surrounds a center point exactly, e.g. the second center point, in a spiral shape. The distance between the first center point and the second center point may be a spatial distance. The gradient coil unit may be implemented to be cylindrical in shape and/or the first conductor structure may be saddle-shaped and/or the eddy current compensating conductor structure may be saddle-shaped. The distance between the first center point and the second center point in the circumferential direction of the gradient coil unit may be less than any suitable proportion of the length of the gradient coil unit, such as for example less than 20%, less than 10%, less than 5% of the length of the gradient coil unit, etc. The distance between the first center point and the second center point in the longitudinal direction of the gradient coil unit may be less than any suitable proportion of the length of the gradient coil unit such as for example, less than 20%, less than 10%, less than 5% of the length of the gradient coil unit, etc. The first center point and the second center point may differ only in their radial distance from the longitudinal axis of the gradient coil unit. The length of the gradient coil unit may correspond to the maximum spatial extent of the gradient coil unit along its longitudinal axis, e.g. in the z-direction.

The eddy current compensating conductor structure can comprise one single winding surrounding a second center point. The eddy current compensating conductor structure can also comprise a plurality of windings surrounding the second center point. The fewer windings the eddy current compensating conductor structure has, the higher is the compensating current required, with the amplitude of the eddy current compensation field remaining the same. The more windings the eddy current compensating conductor structure has, the better the spatial distribution of the eddy current compensation field can be adapted to the spatial distribution of the first magnetic field. This embodiment allows a particularly simple configuration to achieve and efficient vortex field compensation.

For instance, with a first conductor structure that surrounds only one first center point, a current induced in the first conductor structure is concentrated in the area surrounding the first center point, as a result of an activation of a conductor structure comprised by the gradient coil unit, which is why an arrangement and/or implementation of the eddy current compensating conductor structure according to this embodiment can compensate for the first magnetic field in a particularly efficient manner.

One embodiment of the gradient coil unit makes provision for the gradient coil unit to include a secondary conductor structure. The secondary conductor structure can be at least partly implemented to be helical and/or annular and/or circular. The secondary conductor structure can at least partly surround two center points in a helical shape. The secondary conductor structure may be implemented such that a stray magnetic field generated when the first conductor structure and/or the eddy current compensating conductor structure is/are activated can be compensated for by activating the secondary conductor structure, e.g. by generating a compensation stray magnetic field opposite the stray magnetic field by activating the secondary conductor structure.

The radial distance between the first conductor structure and the secondary conductor structure may be any suitable range of values, such as for example between 5 cm and 30 cm, between 10 cm and 22 cm, between 13 cm and 18 cm, etc.

A stray magnetic field is typically a magnetic field that is generated during activation of a conductor structure comprised by the gradient coil unit, e.g. of the first conductor structure, outside the patient-receiving region and/or outside the examination region. The stray magnetic field does not typically contribute to the imaging but can have a negative effect on the imaging. The stray magnetic field can interact with the components that comprise the gradient coil unit. For instance, in an environment that adjoins the gradient coil unit and/or that is electrically conductive, such as, for example, a wall that encloses the cryostat of the main magnet in an inward direction, a temperature shield and/or a radio frequency antenna unit, an electric current can be generated and/or the temperature thereof can be raised.

A gradient coil unit according to this embodiment comprising the secondary conductor structure allows a particularly good reduction of and/or compensation for a stray magnetic field generated in the operation of one of the first conductor structures and/or of the eddy current compensating conductor structure. As a result thereof, the image quality is improved and the rise in temperature of the magnetic resonance device and also of the examination object is reduced.

One embodiment of the gradient coil unit makes provision for the first conductor structure and a further conductor structure to be jointly implemented to generate a magnetic field gradient in a first direction.

This embodiment of the gradient coil unit can be equivalent to a gradient coil unit disclosed in DE 10 2018 206 643, which additionally comprises an eddy current compensating conductor structure. This embodiment of the gradient coil unit can preferably be positioned flexibly within a patient-receiving region of a magnetic resonance device. The further conductor structure may be implemented to reduce a torque in the gradient coil unit, as a result of which the operation of the gradient coil unit can ensue with low levels of vibration.

The advantage of this embodiment is that the gradient coil unit may be implemented to generate a magnetic field gradient with a particularly high homogeneity in the examination region at high rise and decay rates, through simultaneous compensation for the torque and for the vortex field. Moreover, the peripheral nerve stimulation in the examination object and/or the electromagnetic interaction outside the patient-receiving region can be reduced.

One embodiment of the gradient coil unit makes provision for the gradient coil unit to comprise two first conductor structures and eddy current compensating conductor structures respectively, with a first conductor structure and an eddy current compensating conductor structure arranged respectively inside one half of the gradient coil unit, and for the gradient coil unit to be symmetrical.

Typically, two saddle coils arranged symmetrically with each other are required to generate a magnetic field gradient. Two first conductor structures arranged symmetrically with each other may allow the generation of a magnetic field gradient in the first direction. Two eddy current compensating conductor structures arranged symmetrically with each other may allow compensation for the first magnetic field, which first magnetic field is generated by a current induced in the two first conductor structures as a result of activation of a conductor structure comprised by the gradient coil unit.

One embodiment of the gradient coil unit makes provision for the first conductor structure to include a waveguide or hollow conductor, e.g. a monolithic waveguide or hollow conductor.

A current induced in a hollow conductor as a result of activation of a conductor structure comprised by the gradient coil unit may have a particularly high amplitude as a result of the geometry thereof. A resulting first magnetic field may be particularly strong. The hollow conductor can include a cooling medium. The hollow region of the hollow conductor typically has a cross section of any suitable range of values, such as for example between 2 mm$^2$ and 25 mm$^2$, between 5 mm$^2$ and 18 mm$^2$, between 7 mm$^2$ and 13 mm$^2$, etc. This allows efficient cooling of the first conductor structure. According to this embodiment, the first conductor structure may be implemented as a result of the efficient cooling and as a result of the eddy current compensating conductor structure, to generate magnetic field gradients with a particularly high amplitude and with particularly high rise and decay rates and at the same time to generate a high level of homogeneity of the magnetic field gradient in the first direction and/or of the main magnetic field. A first conductor structure implemented as a monolithic semiconductor is also particularly simple to manufacture.

One embodiment of the gradient coil unit makes provision for the first conductor structure to include a conductor with a cross section of any suitable size, such as at least 5 mm$^2$ for instance. The first conductor structure typically comprises a conductor with a cross section having nay suitable range of values, such as for example between 5 mm$^2$ and 150 mm$^2$, between 15 mm$^2$ and 80 mm$^2$, between 35 mm$^2$ and 55 mm$^2$, etc. The greater a cross section of a conductor in the first conductor structure, the greater is typically that in the first conductor structure. According to this embodiment, the first conductor structure comprises a conductor with a cross section of any suitable size such as for example, at least 5 mm$^2$, at least 10 mm$^2$, at least 20 mm$^2$, etc. The gradient coil unit according to this embodiment allows generation of magnetic field gradients with particularly high homogeneity and at the same time high rise and decay rates, in particular with particularly good vortex field compensation.

The disclosure is also based on a gradient system comprising a gradient coil unit according to the disclosure, a first amplifier unit and a compensating amplifier unit, with the first amplifier unit being embodied to activate the first conductor structure and the compensating amplifier unit being embodied to activate the eddy current compensating conductor structure. This gradient system accordingly allows activation of the eddy current compensating conductor structure, which is separate from the activation of the first conductor structure. The compensating amplifier unit may be implemented to generate a compensating current to activate the eddy current compensating conductor structure within any range of time periods, such as for instance less than 2 ms, within less than 1 ms, within less than 0.5 ms, etc., which may correspond maximally to the time constant for the first conductor structure. The compensating amplifier unit may be implemented to intercept an inductive voltage occurring here at the input to the compensating amplifier unit. With an appropriate selection of the compensating amplifier unit, this allows e.g. the adjustment of the eddy current compensation field to the first magnetic field within less than any suitable time period dust as for instance less than 2 ms, within less than 1 ms, within less than 0.5 ms, etc. Consequently, a particularly precise vortex field compensation can be guaranteed.

The advantages of the gradient system according to the disclosure substantially correspond to the advantages of the gradient coil unit according to the disclosure, which are set out above in detail. Features, advantages, or alternative embodiments may also be applied to the other claimed subject matter and/or embodiments, and vice versa.

One embodiment of the gradient coil unit makes provision for the first amplifier unit and the compensating amplifier unit to be embodied such that a maximum electric compensating current generated by the compensating amplifier unit in the eddy current compensating conductor structure is less than any suitable proportion of a first electric current maximally generated by the first amplifier unit in the first conductor structure such as for instance less than 50%, less than 20%, less than 10% of the first electric current maximally generated by the first amplifier unit in the first conductor structure, etc. Such a gradient system can be manufactured in a particularly cost-effective manner.

Figure 3:
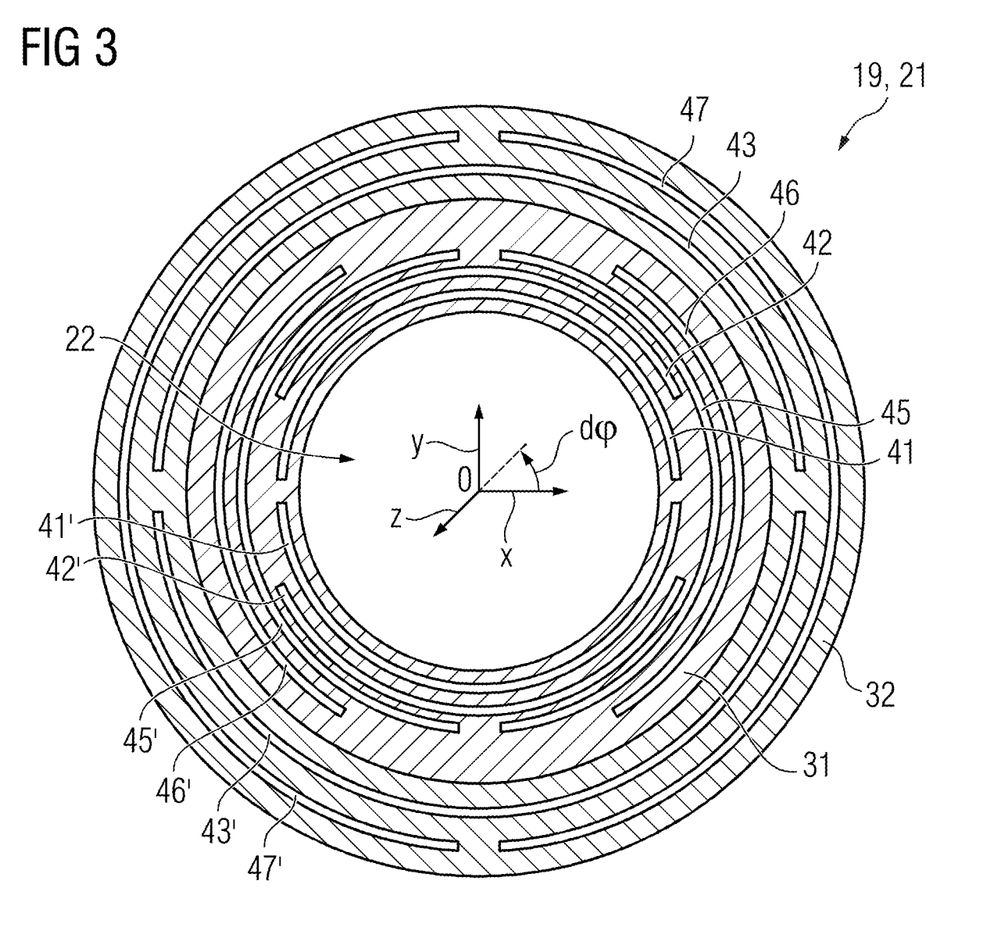
FIG. 3 illustrates a schematic diagram of a first embodiment of an example gradient coil unit in a first view according to one or more embodiments of the present disclosure.

The disclosure is also based on a magnetic resonance device comprising a gradient system according to the disclosure, a gradient control unit, and a main magnet. The magnetic resonance device may include a gradient coil unit, as shown in FIG. 3, comprising at least one first conductor structure, which may be implemented to generate a magnetic field gradient in a first direction, and an eddy current compensating conductor structure. The eddy current compensating conductor structure may be implemented to compensate for a first magnetic field, which first magnetic field is generated by a current induced in the first conductor structure as a result of activation of a conductor structure comprised by the gradient coil unit.

The magnetic resonance device can also comprise a gradient coil unit according to at least one of the aforementioned described embodiments. In addition, the magnetic resonance device may comprise a first amplifier unit and a compensating amplifier unit. The gradient coil unit according to the disclosure and/or the gradient system according to the disclosure may be incorporated in the magnetic resonance device. The gradient coil unit according to the disclosure can also be installed separate from the magnetic resonance device. The gradient coil unit according to the disclosure and/or the gradient system according to the disclosure can be connected to the magnetic resonance device. Embodiments of the magnetic resonance device according to the disclosure are embodied in a similar or identical manner as the embodiments of the gradient coil unit according to the disclosure and/or of the gradient system according to the disclosure. The magnetic resonance device can comprise further control components, which may be necessary and/or advantageous. The magnetic resonance device may be implemented to transmit control signals and/or to receive and/or process control signals. The advantages of the magnetic resonance device according to the disclosure substantially correspond to the advantages of the gradient coil unit according to the disclosure and/or of the gradient system according to the disclosure, which are set out above in detail. Features, advantages, or alternative embodiments referred to here may also be applied to the other claimed subject matter and/or embodiments, and vice versa.

BRIEF DESCRIPTION OF THE DRAWINGS/FIGURES

Further advantages, features, and details of the disclosure will emerge from the embodiments that are described hereinafter and from the drawing.

The drawings show.

DETAILED DESCRIPTION

Figure 1:
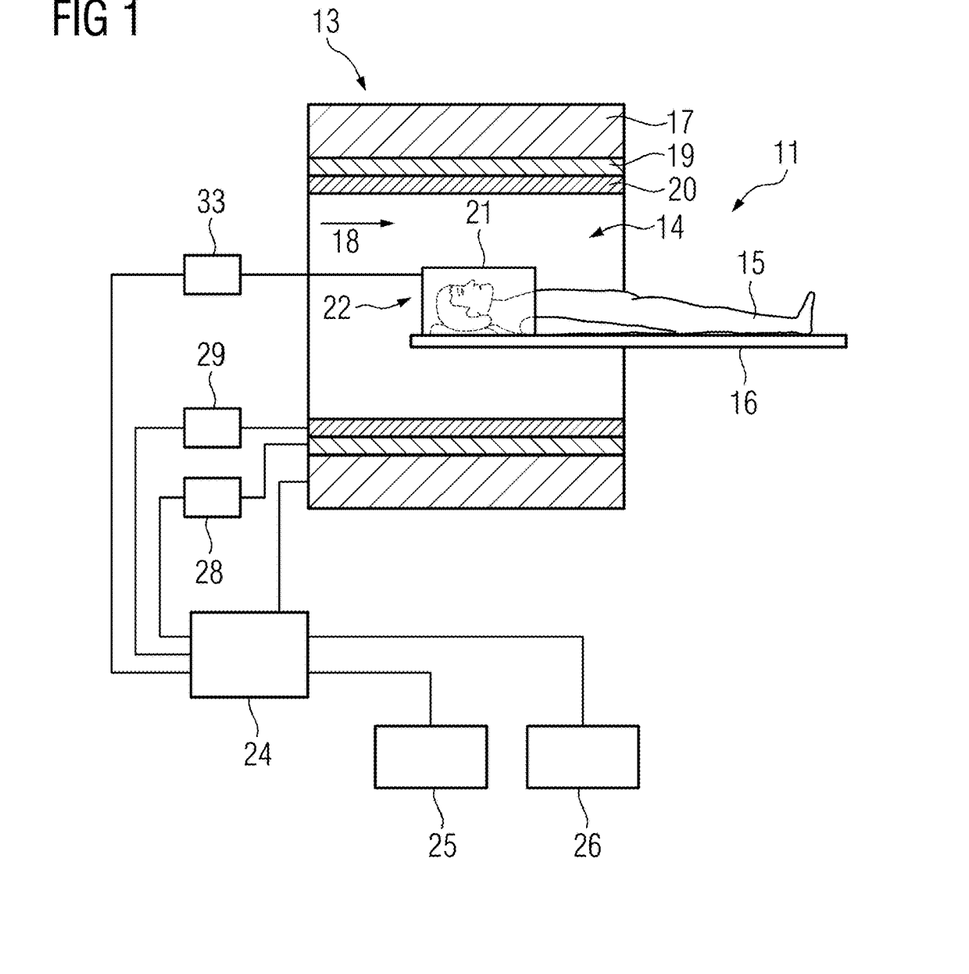
FIG. 1 illustrates a schematic diagram of an example magnetic resonance device according to one or more embodiments of the present disclosure.

FIG. 1 illustrates a schematic diagram of an example magnetic resonance device according to one or more embodiments of the present disclosure. The magnetic resonance device 11 comprises a detector unit formed from a magnet unit 13 with a main magnet 17 to generate a strong and in particular a constant main magnetic field 18. In addition, the magnetic resonance device 11 has a cylindrical patient-receiving region 14 for receiving a patient 15, with the patient-receiving region 14 being surrounded cylindrically in a circumferential direction by the magnet unit 13. The patient 15 can be moved into the patient-receiving region 14 by a patient-positioning apparatus 16 of the magnetic resonance device 11. The patient-positioning apparatus 16 comprises for this purpose a patient table, which is movably arranged inside the magnetic resonance device 11.

The magnet unit 13 can comprise a main gradient coil unit 19 which is used for spatial encoding during imaging. The main gradient coil unit 19 is activated by means of a main gradient control unit 28. The magnetic resonance device 11 can comprise a local gradient coil unit 21, which can be flexibly positioned inside a patient-receiving region 14. The local gradient coil unit 21 can be arranged on the patient-positioning apparatus 16 such that a part of the body, e.g. the head, of the patient 15 can be positioned inside the gradient coil unit 21. The area surrounded by the local gradient coil unit 21 is referred to as the examination region 22. The local gradient coil unit 21 is activated by means of a local gradient control unit 33. The main gradient coil unit 19 is typically used in the absence of a local gradient coil unit 21. The gradient coil unit according to the disclosure can be implemented as a main gradient coil unit 19 and/or as a local gradient coil unit 21. The gradient control unit included in the magnetic resonance device 11 according to the disclosure can be implemented as a main gradient control unit 28 and/or as a local gradient control unit 33.

Furthermore, the magnet unit 13 comprises a radio frequency antenna unit 20, which in the case shown is embodied as a body coil that is fixedly incorporated into the magnetic resonance device 11, and a radio frequency antenna control unit 29 to excite a polarization, which becomes established in the main magnetic field 18 generated by the main magnet 17. The radio frequency antenna unit 20 is activated by the radio frequency antenna control unit 29 and radiates radio frequency pulses with a high frequency into an examination space, which is formed substantially by the patient-receiving region 14.

To control the main magnet 17, the radio frequency antenna control unit 29, the main gradient control unit 28, and/or the local gradient control unit 33, the magnetic resonance device 11 has a control unit 24. The control unit 24 centrally controls the magnetic resonance device 11, such as by, for example, running MR control sequences. In addition, the control unit 24 comprises a reconstruction unit, not shown in greater detail, for reconstructing medical image data that have been acquired during the magnetic resonance examination. The magnetic resonance device 11 has a display unit 25. Control information such as, for example, control parameters, and also reconstructed image data, can be displayed for a user on the display unit 25, for example on at least one monitor. In addition, the magnetic resonance device 11 has an input unit 26, by means of which information and/or control parameters can be input by a user during a measurement procedure. The control unit 24 can include the gradient control unit 28 and/or the radio frequency antenna control unit 29 and/or the display unit 25 and/or the input unit 26.

Each of the functional components of the magnetic resonance device 11 may be implemented as any suitable number and/or combination of hardware and/or software components such as, for instance, a control computer, processing unit, one or more processors, processing circuitry, etc.

The magnetic resonance device 11 that is shown can of course comprise further components that magnetic resonance devices 11 usually have. A general mode of functioning of a magnetic resonance device 11 is moreover known to a person skilled in the art, such that a detailed description of the further components is dispensed with.

Figure 2:
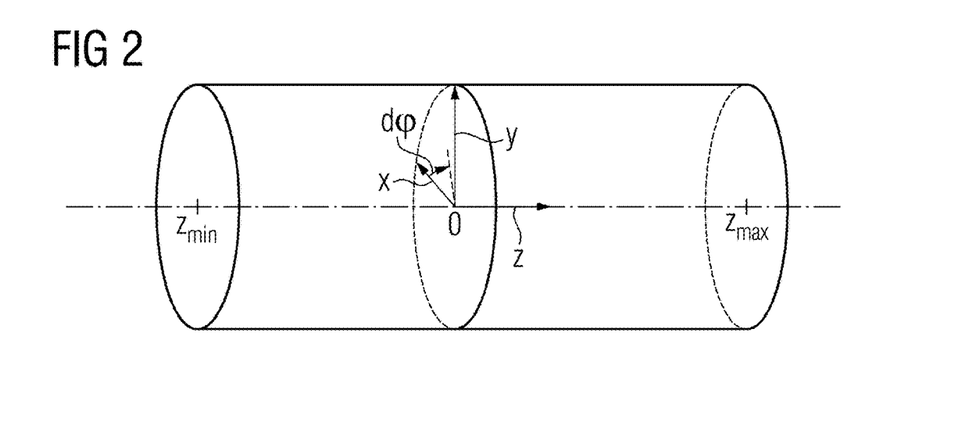
FIG. 2 illustrates a schematic diagram of an example gradient coil unit according to one or more embodiments of the present disclosure.

FIG. 2 shows a schematic diagram of a gradient coil unit 19, 21 to explain the parameters. The gradient coil unit 19, 21 typically has a cylindrical outer surface. The gradient coil unit 19, 21 is typically subdivided into two halves. One half of the gradient coil unit 21 typically comprises at least one first conductor structure 41 and at least one eddy current compensating conductor structure 42. The gradient coil unit 19, 21 typically has at least one first conductor structure 41 and at least one eddy current compensating conductor structure 42 in each of the two halves, respectively. The two halves of the gradient coil unit 19, 21 are typically symmetrical, preferably axially symmetrical with each other.

One half of the gradient coil unit 19, 21 is preferably limited along the z-axis by the two longitudinal ends of the gradient coil unit 19, 21 at zmin and zmax. One half of the gradient coil unit 19, 21 is determined in a first direction by the maximum extent of the gradient coil unit 19, 21 in the first direction. One half of the gradient coil unit 21 is determined in a second direction by the distance of an outer side of the gradient coil unit 21 along the second direction from the origin. The first direction and the second direction are typically perpendicular to one another. If the first conductor structure 41 is embodied to generate a magnetic field gradient in the x-direction, then the first direction corresponds to the x-direction. If the first conductor structure 41 is embodied to generate a magnetic field gradient in the y-direction, then the first direction corresponds to the y-direction.

FIG. 3 shows a schematic diagram of a first embodiment of a gradient coil unit 19, 21 according to the disclosure in a first view. FIG. 3 shows an axial cross section, which may be through the axial center, of a first embodiment of the gradient coil unit 19, 21 according to the disclosure, which unit can be implemented as a local gradient coil unit 21 or as a main gradient coil unit 19. Here, the gradient coil unit 19, 21 is subdivided into a primary coil 31 and a secondary coil 32. The primary coil 31 comprises the first conductor structure 41, 41' and the eddy current compensating conductor structure 42, 42'. The gradient coil unit 19, 21, e.g. the primary coil 31, may comprise the two first conductor structures 41, 41'. Here, the two first conductor structures 41, 41' may be arranged symmetrically to the x-z plane, insofar as the first direction corresponds to the x-direction. The gradient coil unit 19, 21, e.g. the primary coil 31, may comprise the two eddy current compensating conductor structure 42, 42'. The two eddy current compensating conductor structures 42, 42' may be arranged symmetrically to the x-z plane, insofar as the first direction corresponds to the x-direction. Unlike the first conductor structure 41, 41', the eddy current compensating conductor structure 42, 42' has a greater radial distance from the longitudinal axis of the gradient coil unit 19, 21, in the case shown, to the z-axis. The first conductor structure 41, 41' and the eddy current compensating conductor structure 42, 42' accordingly have a different radial distance from the center point 0 of the gradient coil unit 19, 21.

The two first conductor structures 41, 41' may be implemented to generate a magnetic field gradient in the first direction, in particular in the x-direction, in an examination region 22. The two eddy current compensating conductor structures 42, 42' are implemented to compensate for a first magnetic field. The first magnetic field is characterized in that, during activation of a conductor structure in the first conductor structure 41, 41' that is comprised by the gradient coil unit 19, 21, a current is induced, which in turn generates the first magnetic field. In each case, a first conductor structure 41 and eddy current compensating conductor structures 42 are typically arranged inside one half of the gradient coil unit 19, 21. The other first conductor structure 41' and the other eddy current compensating conductor structures 42' are typically arranged inside the other half of the gradient coil unit 19, 21. The first conductor structure 41, 41' and the eddy current compensating conductor structure 42, 42' are saddle-shaped.

Furthermore, the primary coil 31 shown comprises two additional first conductor structures 45, 45' and two additional eddy current compensating conductor structures 46, 46'. The two additional first conductor structures 45, 45' and the two additional eddy current compensating conductor structures 46, 46' are typically constructed in a similar way to the two first conductor structures 41, 41' and the two second conductor structures 42, 42', yet these differ by an angle dφ of 90°. Consequently, in the case shown, the two additional first conductor structures 45, 45' are implemented to generate a magnetic field gradient in the y-direction. The two additional eddy current compensating conductor structures 46, 46' are typically implemented to compensate for an additional first magnetic field that is generated by activating a conductor structure comprised by the gradient coil unit from at least one of the additional first conductor structures 45, 45'. The primary coil 31 that is shown is consequently implemented to generate magnetic field gradients in the x-direction and in the y-direction and to compensate for a current that is induced during generation by activating a conductor structure in a first conductor structure 41, 41', 45, 45'.

The secondary coil 32 may comprise two secondary conductor structures 43, 43'. The gradient coil unit 19, 21, in particular the secondary coil 32, may comprise the two secondary conductor structures 43, 43'. The two secondary conductor structures 43, 43' are preferably arranged symmetrically to the x-z plane, insofar as the first direction corresponds to the x-direction.

The secondary coil 32, e.g. the secondary conductor structure 43, 43', is implemented to compensate for a stray magnetic field that occurs during the generation of a magnetic field gradient by means of the two first conductor structures 41, 41'. The secondary coil 32 preferably has a greater radius, e.g. with regard to the center point 0 and/or the longitudinal axis of the gradient coil unit 21 than does the primary coil 31.

Furthermore, the secondary coil 32 that is shown comprises two additional secondary conductor structures 47, 47'. The two additional secondary conductor structures 47, 47' are typically constructed in a similar way to the two third conductor structures 43, 43', yet these differ from each other by an angle dφ of 90°. Consequently, in the case shown, the two additional secondary conductor structures 47, 47' are jointly embodied to compensate for a stray magnetic field that occurs during the generation of a magnetic field gradient by means of the two additional first conductor structures 45, 45'. The additional secondary conductor structure 47, 47' is accordingly implemented to compensate for a stray magnetic field that occurs during the generation of a magnetic field gradient in the y-direction. The secondary coil 32 that is shown is consequently implemented to compensate for stray magnetic fields that occur during the generation of magnetic field gradients in the x-direction and in the y-direction.

The gradient coil unit 19, 21 may comprise a further conductor structure comprised by the primary coil 31, which structure is not shown in further detail and which is implemented to generate a magnetic field gradient in the z-direction. The gradient coil unit 19, 21 may comprise a further conductor structure comprised by the secondary coil 32, which structure is not shown in further detail and which is embodied to generate a magnetic field gradient in the z-direction.

The conductor structures mentioned 41, 42, 43, 45, 46, 47, 41', 42', 43', 45', 46', 47' are typically at least partly arranged concentrically and/or are nested one inside another. The sequence thereof, e.g. the distance thereof from the center point 0 of the gradient coil unit 19, 21 is shown by way of example in FIG. 3 and can also be implemented in a different way. For example, the secondary conductor structure 43, 43' comprises the eddy current compensating conductor structure 42, 42' at least partly radially and the eddy current compensating conductor structure 42, 42' comprises the first conductor structure 41, 41' at least partly radially. The secondary conductor structure 43, 43' and the eddy current compensating conductor structure 42, 42' are typically arranged concentrically. The first conductor structure 41, 41' and the eddy current compensating conductor structure 42, 42' are typically arranged at least partly concentrically.

Figure 4:
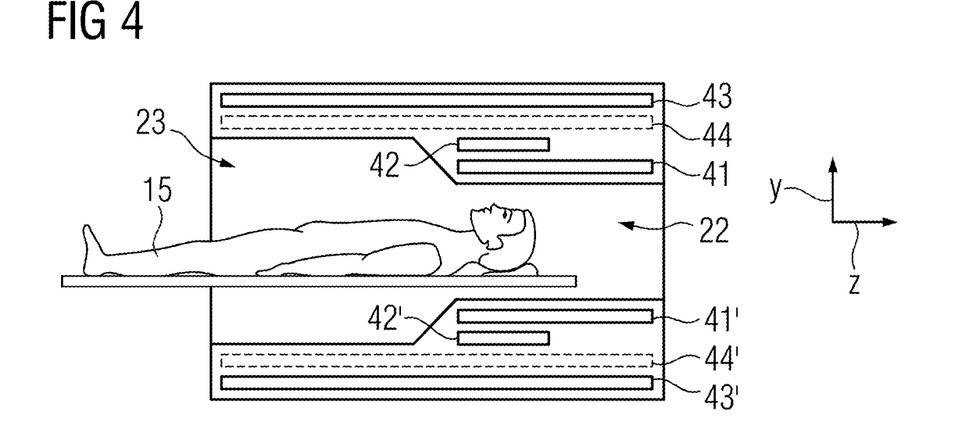
FIG. 4 illustrates a schematic diagram of a second embodiment of an example gradient coil unit in a second view according to one or more embodiments of the present disclosure.

FIG. 4 shows a schematic diagram of a second embodiment of a gradient coil unit according to the disclosure constructed as a local gradient coil unit 21 in a second view. FIG. 4 shows a cross section y=0 of a local gradient coil unit 21. The second embodiment can correspond to the first embodiment shown in FIG. 3 when the first embodiment is implemented as a local gradient coil unit 21. The gradient coil unit 21 comprises the first conductor structure 41, 41', the eddy current compensating conductor structure 42, 42' and the secondary conductor structure 43, 43', with the first conductor structure 41, 41' being shorter in a longitudinal direction, that is, parallel to the z-axis, than the secondary conductor structure 43, 43'. The length of the eddy current compensating conductor structure 42, 42' in a longitudinal direction typically corresponds in a longitudinal direction maximally to the length of the first conductor structure 41, 41'. The eddy current compensating conductor structure 42, 42' is typically shorter in a longitudinal direction than the first conductor structure 41, 41'.

The gradient coil unit 21 optionally comprises a further conductor structure 44, 44', with the first conductor structure 41, 41' and the further conductor structure 44, 44' being jointly embodied to generate a magnetic field gradient in a first direction. The radial construction of the conductor structures of the gradient coil unit 21 can be as follows from the inside outwards: the first conductor structure 41, 41', the eddy current compensating conductor structure 42, 42', optionally the further conductor structure 44, 44', the secondary conductor structure 43, 43'. Alternatively, the following sequence can also be selected to reduce interference: the first conductor structure 41, 41', optionally the further conductor structure 44, 44', the eddy current compensating conductor structure 42, 42', the secondary conductor structure 43, 43'.

The region located inside the gradient coil unit 21, which is comprised radially only by the further conductor structure 44, 44' and/or by the secondary conductor structure 43, 43', but not by the first conductor structure 41, 41', can be referred to as the protruding region 23. The protruding region 23 may not be part of the examination region 22. Inside the examination region 22, the magnetic field gradient is typically particularly homogeneous. The examination region 22 is typically only a partial region of the region surrounded by the first conductor structure 41, 41' and/or of the region comprised by the gradient coil unit 21 minus the protruding region 23. The examination region 22 typically adjoins the protruding region 23.

In the context of a magnetic resonance examination, magnetic resonance signals are typically acquired and/or encoded inside the examination region 22. Accordingly, a part of the further conductor structure 44, 44' that comprises the protruding region 23 may be mainly implemented to reduce a torque exerted on the gradient coil unit 21 during the generation of a magnetic field gradient. However, the first conductor structure 41, 41' and the further conductor structure 44, 44' can be jointly implemented according to this embodiment to generate a magnetic field gradient in the examination region 22 that is surrounded by the first conductor structure 41, 41'. The longitudinal end of the gradient coil unit 21 that adjoins the protruding region 23 is denoted hereinafter by zmin.

Figure 5:
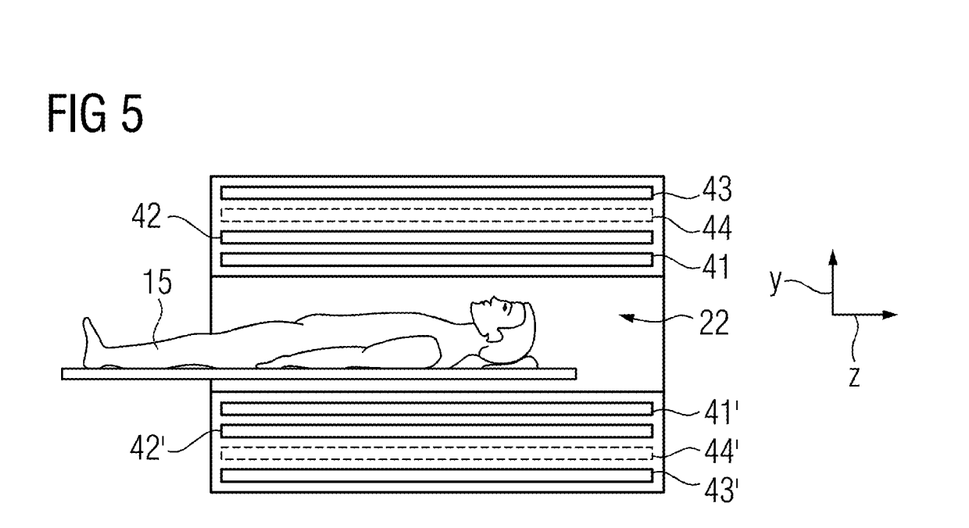
FIG. 5 illustrates a schematic diagram of a third embodiment of an example gradient coil unit in a second view according to one or more embodiments of the present disclosure.

FIG. 5 shows a schematic diagram of a third embodiment of a gradient coil unit 19, 21 according to the disclosure in a second view. FIG. 5 shows a cross section at y=0 of a third embodiment of the gradient coil unit 19, 21 according to the disclosure, which can be implemented as a local gradient coil unit 21 or as a main gradient coil unit 19. The third embodiment can correspond with the first embodiment shown in FIG. 3. The third embodiment shown in FIG. 5 of a gradient coil unit 19, 21 according to the disclosure differs from a second embodiment shown in FIG. 4 in that there is now no protruding region 23 as a result of the cylindrical geometry of the gradient coil unit 19, 21. The radial construction of the conductor structures of the gradient coil unit 21 can be implemented in a similar way to the construction described in FIG. 4.

Figure 6:
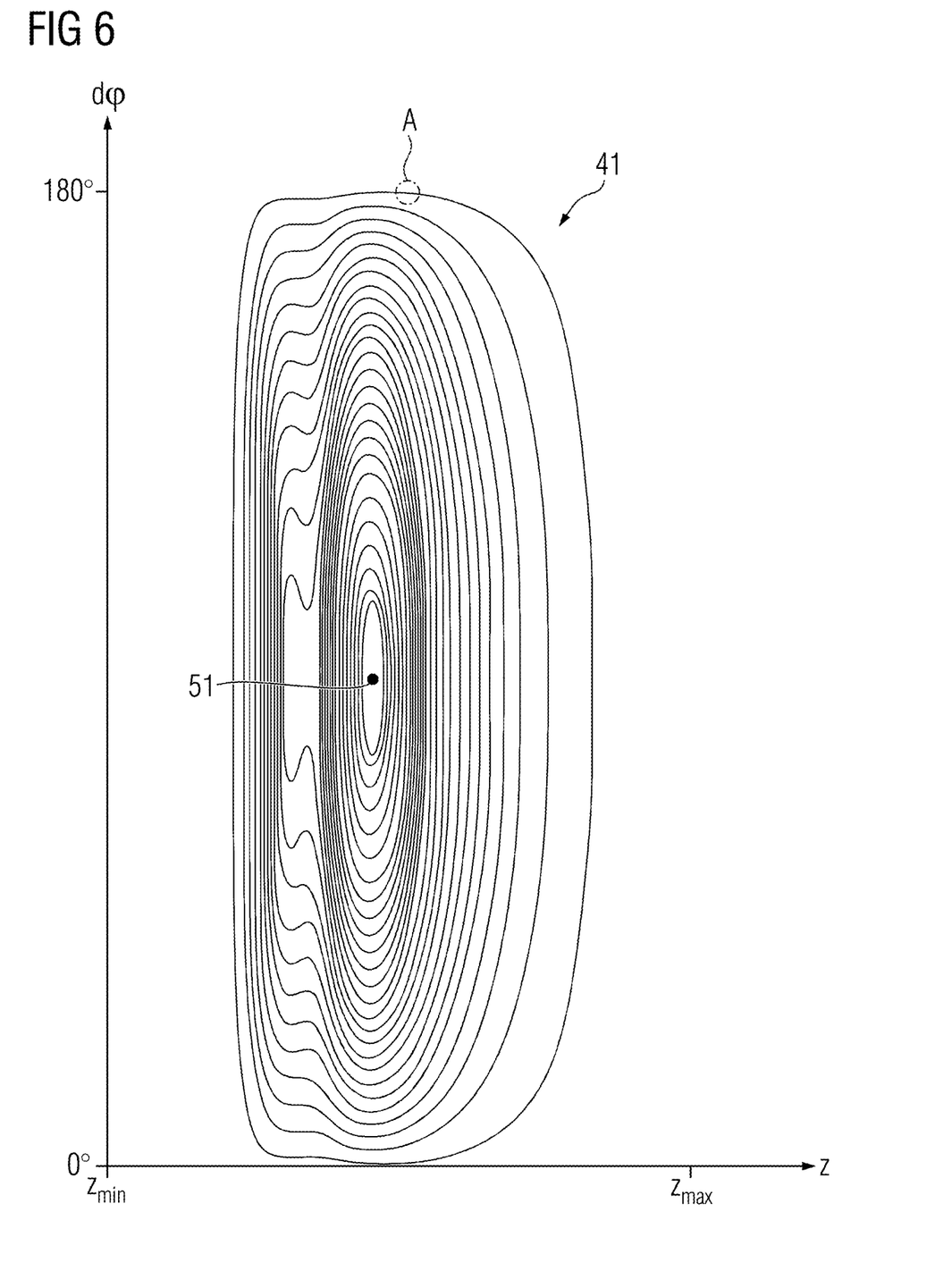
FIG. 6 illustrates a first schematic diagram of an embodiment of an example first conductor structure according to one or more embodiments of the present disclosure.

FIG. 6 shows a schematic diagram of an embodiment of a first conductor structure 41. This embodiment of the first conductor structure 41 may be comprised by a second embodiment of the gradient coil unit, in particular by the embodiment of the gradient coil unit 21 according to the disclosure shown in FIG. 4. The first conductor structure 41 is in this case shown as planar, in particular unrolled. The ordinate describes dip. Inside the gradient coil unit 21 is the first conductor structure 41, e.g. saddle-shaped, with a first radius to the longitudinal axis of the gradient coil unit 21. It is evident in particular that the first conductor structure 41 has a distance of at least one fifth, for example, around one quarter, of the length of the gradient coil unit 21 at the longitudinal end at zmin, which typically corresponds to the protruding region 23. The first conductor structure 41 may be implemented to be at least partly spiral and/or circular and/or helical. In the embodiment shown in a simplified form, the first conductor structure 41 surrounds the first center point 51 in a circular manner. The first conductor structure 41 may surround exactly one first center point 51. Typically, the first conductor structure 41 runs in a similar manner to the one shown, but in a spiral. The first conductor structure 41 can also surround a further center point in a spiral. The position of the first center point 51 on the z-axis typically defines the center point of the gradient coil unit 21 and/or the center point of the examination region 22. The first conductor structure 41 is implemented asymmetrically according to this embodiment.

Figure 7:
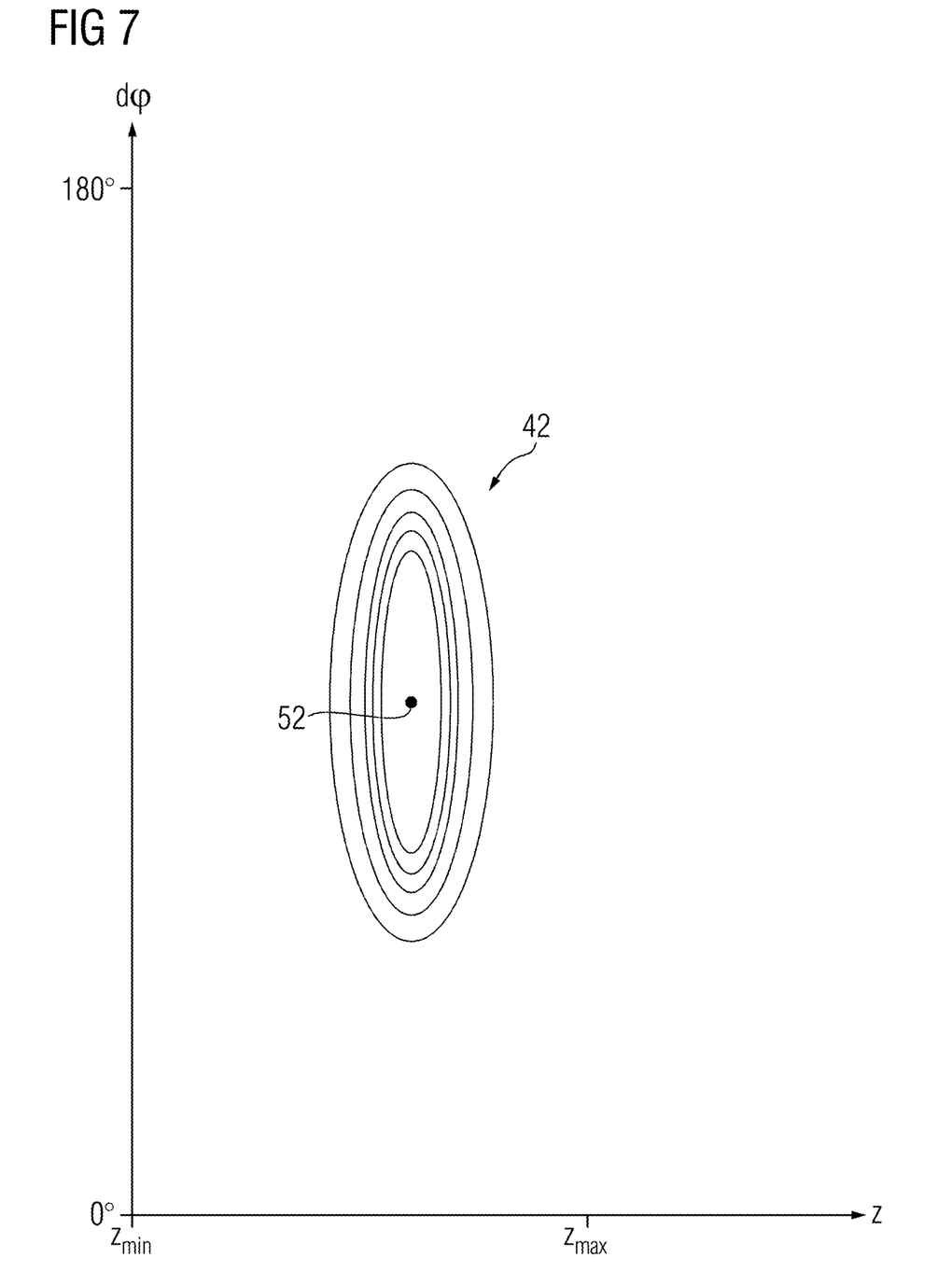
FIG. 7 illustrates a schematic diagram of an embodiment of an example eddy current compensating conductor structure according to one or more embodiments of the present disclosure.

FIG. 7 shows a schematic diagram of an embodiment of an eddy current compensating conductor structure 42. The eddy current compensating conductor structure 42 is in this case shown as planar, in particular unrolled. Inside the gradient coil unit 21, the second conductor structure 42 may be e.g. saddle-shaped. The eddy current compensating conductor structure 42 typically extends maximally e.g. over 70%, over maximally 50%, over maximally 30%, etc. of the length of the gradient coil unit 21 in the z-direction. The eddy current compensating conductor structure 42 surrounds a second center point 52 in a spiral. The eddy current compensating conductor structure 42 may be implemented to be at least partly spiral and/or circular and/or helical. The eddy current compensating conductor structure 42 may surround exactly one second center point 52. Typically the eddy current compensating conductor structure 42 runs in a similar manner to the one shown, but in a spiral shape. The eddy current compensating conductor structure 42 can also comprise only one circular conductor. The first center point 51 and the second center point 52 may have a distance e.g. of less than 20%, less than 10%, less than 5%, etc. of the length of the gradient coil unit in the z-direction. The first center point 51 can be spaced apart from the second center point 52 in the z-direction and/or in direction $d\varphi$.

Figure 8:
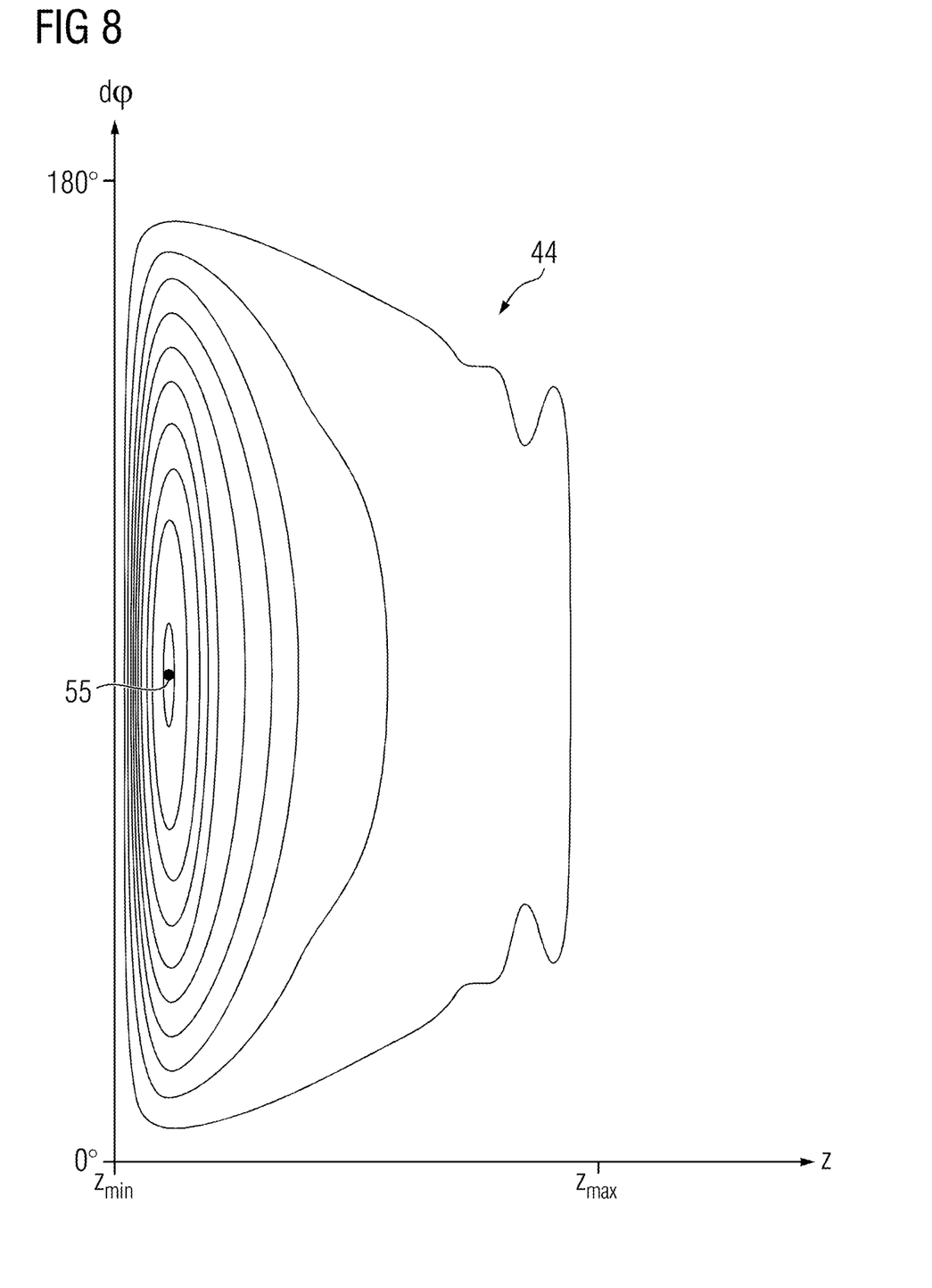
FIG. 8 illustrates a schematic diagram of an embodiment of an example further conductor structure according to one or more embodiments of the present disclosure.

FIG. 8 shows a schematic diagram of an embodiment of a further conductor structure 44. The further conductor structure 44 typically extends over the entire extent of the gradient coil unit 21 in the z-direction. The first conductor structure 41 and/or the further conductor structure 44 can be implemented to compensate for a torque exerted on the gradient coil unit 21 during generation of a magnetic field gradient. The further conductor structure 44 is typically implemented to compensate for a torque exerted on the gradient coil unit 21 during generation of a magnetic field gradient. In addition, the further conductor structure 44 is typically implemented to generate a magnetic field gradient jointly with the first conductor structure 41. For both functionalities, the further conductor structure 44 is typically arranged in a spiral shape around a further center point 55. The further center point 55 may be positioned closer at the longitudinal end that encloses the protruding region 23 of the gradient coil unit 21 than at the longitudinal end of the gradient coil unit 21 that is averted from the protruding region 23.

Figure 9:
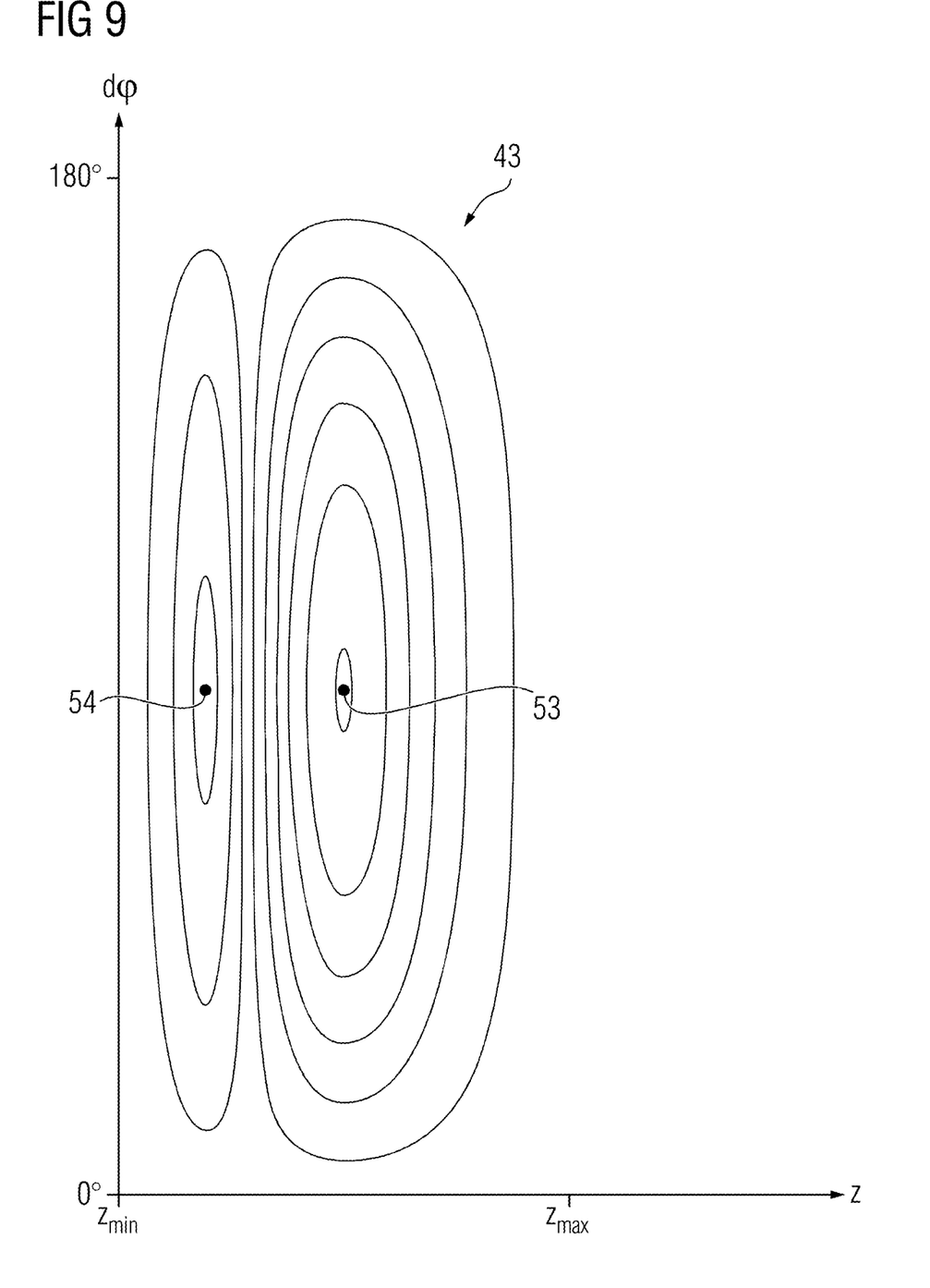
FIG. 9 illustrates a schematic diagram of an embodiment of an example secondary conductor structure according to one or more embodiments of the present disclosure.

FIG. 9 shows a schematic diagram of an embodiment of a secondary conductor structure 43. The secondary conductor structure 43 typically extends e.g. over at least 80%, over at least 90%, etc. of the extent of the gradient coil unit 21 in the z-direction. The secondary conductor structure 43 is typically implemented to compensate for a stray magnetic field that occurs during the generation of a magnetic field gradient by means of a first conductor structure 41 and/or of a further conductor structure 44. In the embodiment shown in a simplified form, the secondary conductor structure 43 surrounds the center points 53, 54 respectively in a circular manner. Typically, the third conductor structure 43 has a similar trajectory to the one shown, but in a spiral shape. When viewing the projection onto the z-axis, the first center point 51 and/or the second center point 52 may be arranged between the two center points 53, 54.

Figure 10:
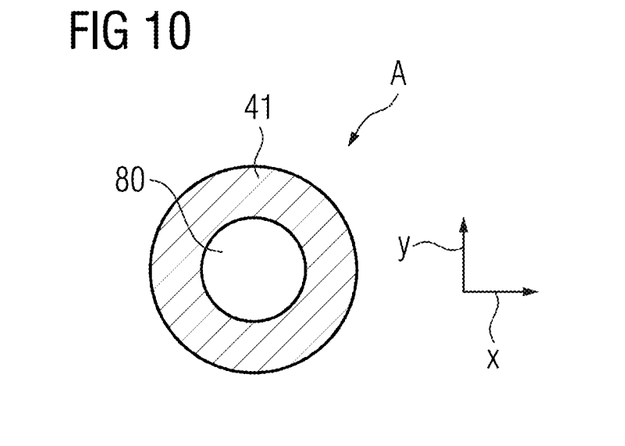
FIG. 10 illustrates a second schematic diagram of an embodiment of an example first conductor structure showing a cross section according to one or more embodiments of the present disclosure.

FIG. 10 shows a second schematic diagram of an embodiment of a first conductor structure 41 in cross section. According to this embodiment, the first conductor structure 41 is embodied as a waveguide, e.g. as a monolithic waveguide or a hollow conductor enclosing a hollow space 80. The position and the aspect of the first conductor structure 41 is characterized by the identifier A in FIG. 6. The first conductor structure 41 may have a cross section e.g. of at least 10 mm^2, at least 18 mm^2, etc.

Figure 11:
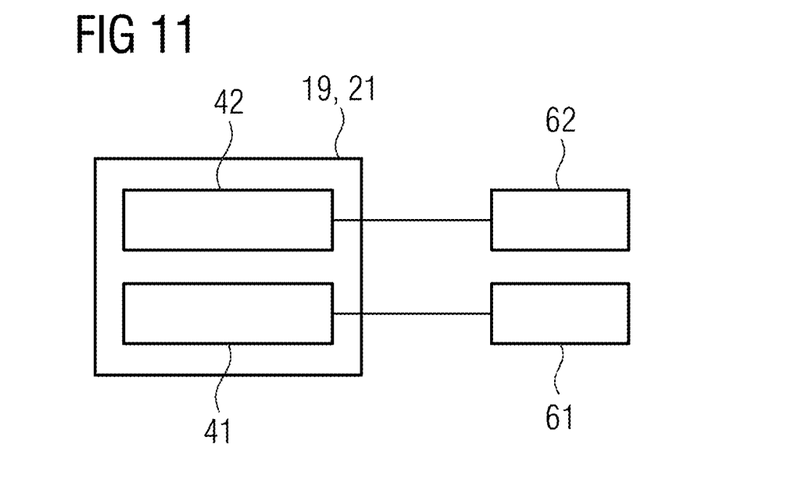
FIG. 11 illustrates a schematic diagram of an example gradient system according to one or more embodiments of the present disclosure.

FIG. 11 shows a schematic diagram of a gradient system according to the disclosure. The gradient system comprises a gradient coil unit 19, 21 according to the disclosure, a first amplifier unit 61 and a compensating amplifier unit 62, with the first amplifier unit 61 being embodied to activate the first conductor structure 41. The compensating amplifier unit 62 is implemented to activate the eddy current compensating conductor structure 42. The amplifier unit 61 and the compensating amplifier unit 62 are typically implemented such that a maximal electric compensating current generated by the compensating amplifier unit 62 in the eddy current compensating conductor structure 42 is e.g. less than 50% of a maximal first electric current generated by the first amplifier unit 61 in the first conductor structure 41.

Although the disclosure has been illustrated and described in greater detail by the preferred embodiments, the disclosure is not restricted to the examples disclosed, and other variants can be derived therefrom by a person skilled in the art, without going beyond the scope of the disclosure.

The various functional blocks, apparatuses, modules, units, components of physical or functional units, etc., as shown in the drawings and described herein may be implemented unless otherwise noted via any suitable number and type of computer processors, hardware components, the execution of software algorithms, or combinations thereof. Moreover, any of the components described herein as a "unit" may alternatively be referred to as a "system," "circuitry," or "device."

The various components described herein may be "embodied" or "implemented" to perform various functions such as the generation of magnetic field gradients in particular directions. For example. In this context, it is understood that the terms "embodied" or "implemented" mean that the relevant component is designed or otherwise configured to perform the task as described herein.

What is claimed is:
1. A gradient coil system, comprising:
at least one first conductor structure configured to generate a magnetic field gradient in a first direction; and
at least one eddy current compensating conductor structure configured to compensate for a first magnetic field,
wherein the first magnetic field is generated by a current induced in the at least one first conductor structure as a result of activation of another conductor structure of the gradient coil system,
wherein the first conductor structure has at least one of (i) a spiral shape, (ii) a partly helical shape, (iii) an annular shape, and (iv) a circular shape, and surrounds a first center point of the gradient coil system,
wherein the at least one eddy current compensating conductor structure at least one of (i) a spiral shape, (ii) a partly helical shape, (iii) an annular shape, and (iv) a circular shape, and surrounds a second center point, and wherein the first center point and the second center point have a distance apart of less than 10% of a length of the gradient coil system.

2. The gradient coil system as claimed in claim 1, wherein the at least one first conductor structure and the at least one eddy current compensating conductor structure are saddle-shaped.

3. The gradient coil system as claimed in claim 1, wherein the at least one first conductor structure and the at least one eddy current compensating conductor structure are positioned a different radial distance from a center point of the gradient coil system.

4. The gradient coil system as claimed in claim 1, wherein the at least one first conductor structure is asymmetric about a line formed between a center point of the at least one first conductor structure that passes over a surface of the at least one first conductor structure.

5. The gradient coil system as claimed in claim 1, wherein the gradient coil system comprises a second conductor structure.

6. The gradient coil system as claimed in claim 1, wherein the at least one first conductor structure is from among a first and a further conductor structure, the first conductor structure and the further conductor structure being configured to jointly generate the magnetic field gradient in the first direction.

7. The gradient coil system as claimed in claim 1, wherein:
the at least one first conductor structure is from among two first conductor structures,
the at least one eddy current compensating conductor structure is from among two eddy current compensating conductor structures,
the gradient coil system is symmetrical and comprises the two first conductor structures and the two eddy current compensating conductor structures, and
one of the two first conductor structures and one of the two eddy current compensating conductor structures is each respectively arranged inside one half of the gradient coil system.

8. The gradient coil system as claimed in claim 1, wherein the at least one first conductor structure comprises a monolithic hollow conductor.

9. The gradient coil system as claimed in claim 1, wherein the at least one first conductor structure comprises a conductor having a cross section of at least 5 mm².

10. A gradient system, comprising:
a gradient coil system including:
at least one first conductor structure configured to generate a magnetic field gradient in a first direction; and
at least one eddy current compensating conductor structure configured to compensate for a first magnetic field, the first magnetic field being generated by a current induced in the at least one first conductor structure as a result of activation of another conductor structure of the gradient coil system;
first amplifier circuitry configured to activate the at least one first conductor structure; and
compensating amplifier circuitry configured to activate the at least one eddy current compensating conductor structure
wherein the first conductor structure has at least one of (i) a spiral shape, (ii) a partly helical shape, (iii) an annular shape, and (iv) a circular shape, and surrounds a first center point of the gradient coil system,
wherein the at least one eddy current compensating conductor structure at least one of (i) a spiral shape, (ii) a partly helical shape, (iii) an annular shape, and (iv) a circular shape, and surrounds a second center point, and
wherein the first center point and the second center point have a distance apart of less than 10% of a length of the gradient coil system.

11. The gradient system as claimed in claim 10, wherein the first amplifier circuitry and the compensating amplifier circuitry are configured such that a maximal electric compensating current generated by the compensating amplifier circuitry in the at least one eddy current compensating conductor structure is less than 50% of a maximal electric current generated by the first amplifier circuitry in at least one first conductor structure.

12. A magnetic resonance device, comprising:
a gradient control circuitry;
a main magnet;
a gradient coil system including:
at least one first conductor structure configured to generate a magnetic field gradient in a first direction; and
at least one eddy current compensating conductor structure configured to compensate for a first magnetic field, the first magnetic field being generated by a current induced in the at least one first conductor structure as a result of activation of another conductor structure of the gradient coil system;
first amplifier circuitry configured to activate the at least one first conductor structure; and
compensating amplifier circuitry configured to activate the at least one eddy current compensating conductor structure
wherein the first conductor structure has at least one of (i) a spiral shape, (ii) a partly helical shape, (iii) an annular shape, and (iv) a circular shape, and surrounds a first center point of the gradient coil system,
wherein the at least one eddy current compensating conductor structure at least one of (i) a spiral shape, (ii) a partly helical shape, (iii) an annular shape, and (iv) a circular shape, and surrounds a second center point, and
wherein the first center point and the second center point have a distance apart of less than 10% of a length of the gradient coil system.

* * * * *